(12) United States Patent
Chen et al.

(10) Patent No.: US 12,142,873 B2
(45) Date of Patent: Nov. 12, 2024

(54) ELECTRONIC DEVICE AND WATERPROOF MEMBER THEREOF

(71) Applicant: Wistron NeWeb Corp., Hsinchu (TW)

(72) Inventors: Te-Wei Chen, Hsinchu (TW); Kai-Hsiang Chou, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 222 days.

(21) Appl. No.: 17/722,750

(22) Filed: Apr. 18, 2022

(65) Prior Publication Data

US 2023/0261411 A1    Aug. 17, 2023

(30) Foreign Application Priority Data

Feb. 17, 2022  (TW) .................................. 111105762

(51) Int. Cl.
| | |
|---|---|
| *H01R 13/52* | (2006.01) |
| *H01R 13/639* | (2006.01) |
| *H05K 5/02* | (2006.01) |
| *H05K 5/03* | (2006.01) |

(52) U.S. Cl.
CPC ..... *H01R 13/5202* (2013.01); *H01R 13/5213* (2013.01); *H01R 13/639* (2013.01); *H05K 5/0247* (2013.01); *H05K 5/03* (2013.01)

(58) Field of Classification Search
CPC ............ H01R 13/5202; H01R 13/5213; H01R 13/639; H05K 5/0247; H05K 5/03
See application file for complete search history.

(56) References Cited

U.S. PATENT DOCUMENTS

| | | | | |
|---|---|---|---|---|
| 5,395,266 | A  * | 3/1995  | Abe ................... | H01R 13/5205 |
| | | | | 439/587 |
| 7,101,212 | B1 * | 9/2006  | Larkin ................ | H01R 24/64 |
| | | | | 439/344 |
| 9,130,305 | B2 * | 9/2015  | Ramos ............... | H01R 13/5205 |
| 9,237,667 | B2 * | 1/2016  | Tamai ................. | H01B 3/441 |
| 9,461,397 | B2 * | 10/2016 | Feldmeier .......... | H01R 13/5221 |
| 10,483,685 | B2 * | 11/2019 | Hu ...................... | H01R 13/5202 |
| 11,296,453 | B2 * | 4/2022  | Komori ............... | H01R 13/523 |
| 11,621,106 | B2 * | 4/2023  | Aoshima ............ | H01R 13/5202 |
| | | | | 174/650 |
| 2006/0166554 | A1 * | 7/2006  | Hung .................. | H01R 13/5205 |
| | | | | 439/589 |
| 2011/0181002 | A1 * | 7/2011  | Fujita ................. | H02G 15/013 |
| | | | | 277/616 |

(Continued)

FOREIGN PATENT DOCUMENTS

| | | |
|---|---|---|
| CN | 102623837 A | 8/2012 |
| CN | 206471580 U * | 9/2017 |

(Continued)

*Primary Examiner* — Rockshana D Chowdhury
*Assistant Examiner* — Martin Antonio Asmat Uceda
(74) *Attorney, Agent, or Firm* — McClure, Qualey & Rodack, LLP

(57) ABSTRACT

An electronic device and a waterproof member of the electronic device are provided. The electronic device includes a device body, a cable, and a waterproof member. The device body includes a socket. The cable includes a plug unit and a cable body. The plug unit is disposed at one end of the cable body and is adapted to be connected to the socket. The waterproof member is sleeved over at least a portion of the plug unit and includes an elastic material.

8 Claims, 10 Drawing Sheets

(56) References Cited

U.S. PATENT DOCUMENTS

2018/0248300 A1\* 8/2018 Hu .................... H01R 13/5202
2020/0405140 A1 12/2020 Lin

FOREIGN PATENT DOCUMENTS

| CN | 208127519 U | | 11/2018 |
|---|---|---|---|
| CN | 110251260 A | | 9/2019 |
| JP | 2010086766 A | \* | 4/2010 |
| TW | I664886 B | | 7/2019 |

\* cited by examiner

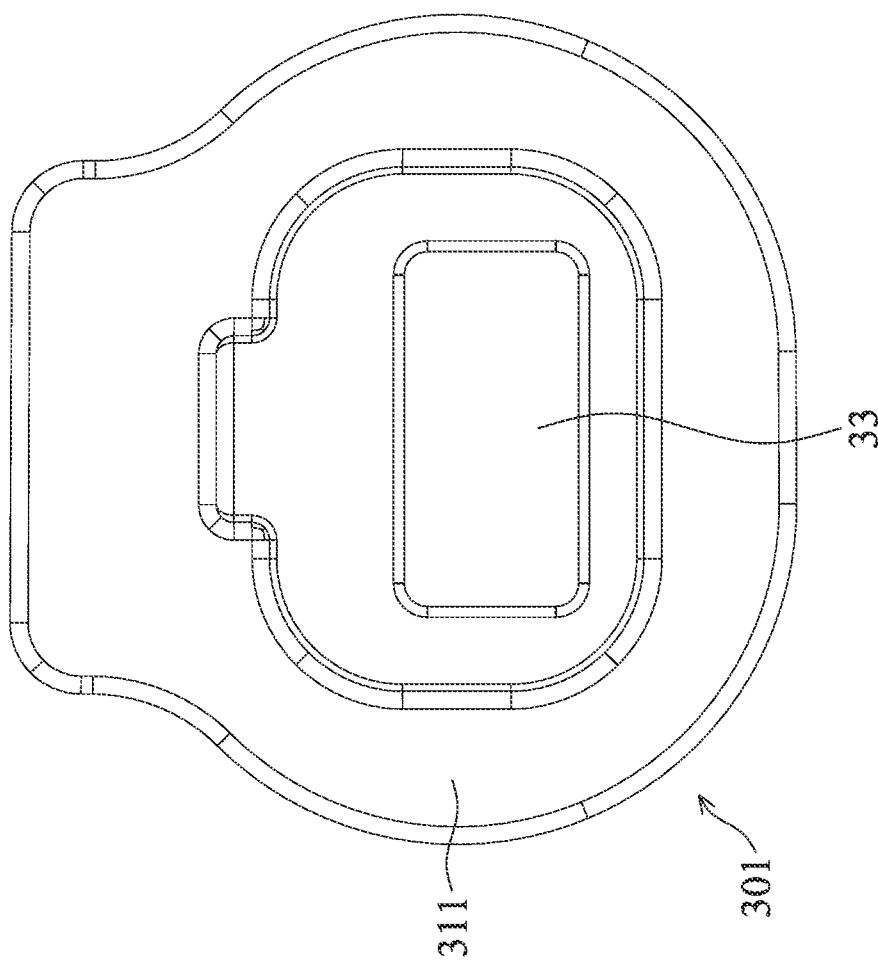

ELECTRONIC DEVICE AND WATERPROOF MEMBER THEREOF

CROSS REFERENCE TO RELATED APPLICATIONS

This application claims the benefit of priority to Taiwan Patent Application No. 111105762, filed on Feb. 17, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND OF THE INVENTION

Field of the Invention

The present disclosure relates to a waterproof member, and more particularly, to a waterproof member of an electronic device.

Description of the Related Art

With the development of wireless communication technology, outdoor network repeaters are also gradually used. Since outdoor network repeaters are affected by outdoor environment and so are prone to problems related to vapor, dust, etc., they must be equipped with a cable gland to prevent contaminations. Conventional cable glands not only have complex structures and high cost, they are also difficult to assemble and disassemble, and so it is troublesome for users when working with network cables.

BRIEF SUMMARY OF THE INVENTION

In view of the aforementioned issues, it is an object of the present disclosure to provide an electronic device, which includes a device body, a cable, and a waterproof member. The device body includes a socket. The cable includes a plug unit and a cable body. The plug unit is disposed at one end of the cable body and is adapted to be connected to the socket. The waterproof member is sleeved over at least a portion of the plug unit. The waterproof member includes an elastic material.

It is another object of the present disclosure to provide a waterproof member that is adapted to be sleeved over a cable. The waterproof member includes a member body. A through hole is formed in the member body. The cable includes a plug unit and a cable body. The plug unit is disposed at one end of the cable body. When the plug unit is inserted to pass through the through hole, the waterproof member is sleeved over at least a portion of the plug unit.

Preferably, the waterproof member is made of elastic material, such as rubber. The waterproof member of the present disclosure has a simple structure and low cost and is easy to assemble. Moreover, the waterproof member of the present disclosure is adaptable to most types of cables for providing waterproof and dustproof protections, and is convenient and easy to assemble or disassemble by users.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present invention can be more fully understood by reading the subsequent detailed description and examples with references made to the accompanying drawings, wherein:

FIG. 2C is a schematic front view of a waterproof member according to a first embodiment of the present disclosure;

DETAILED DESCRIPTION OF THE INVENTION

Figure 1A:
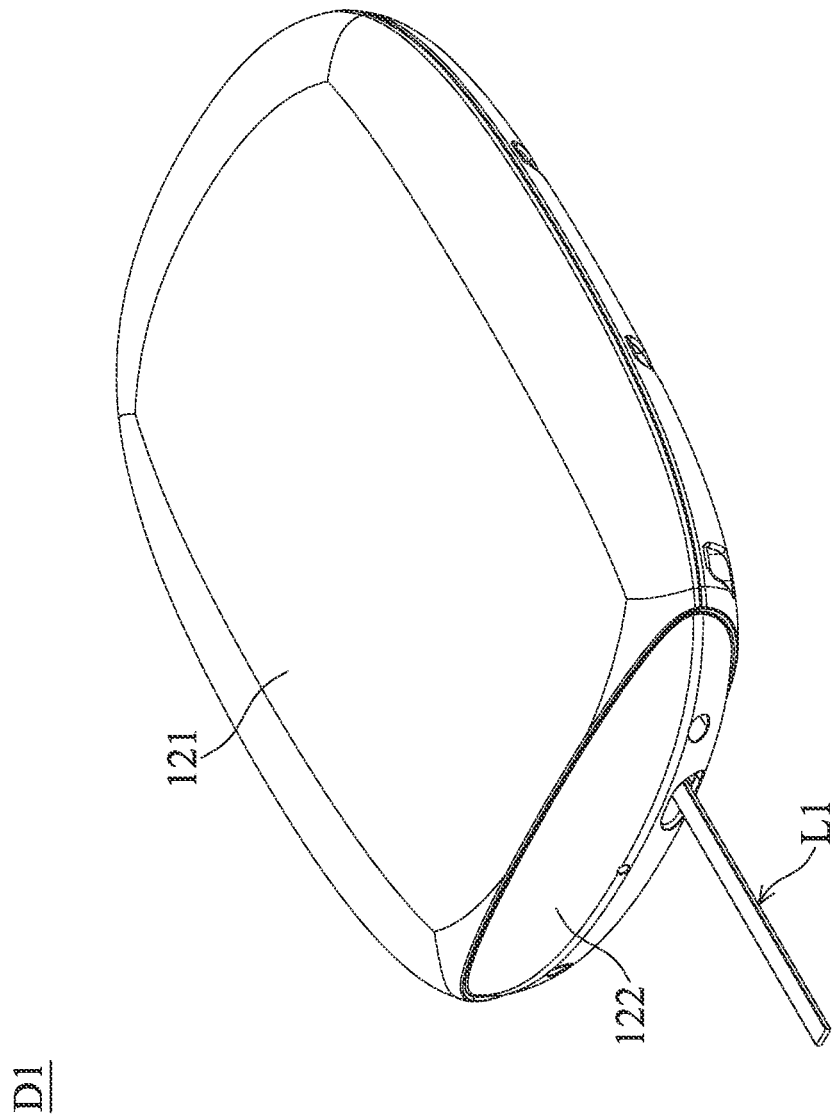
FIG. 1A is a schematic perspective view of an electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1B:
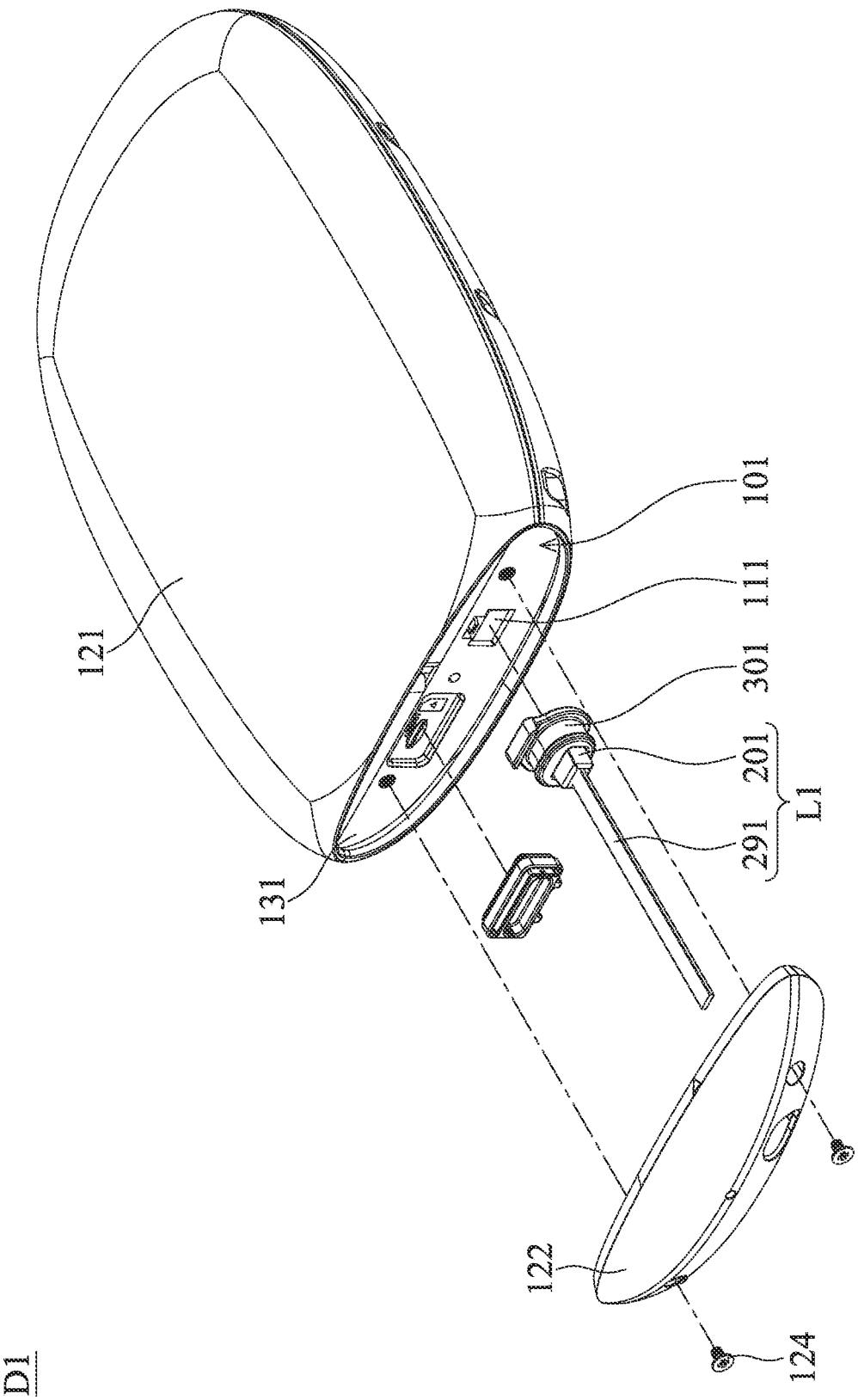
FIG. 1B is a schematic partially exploded view of an electronic device according to a first embodiment of the present disclosure.

Referring to FIG. 1A and FIG. 1B, an electronic device D1 includes a device body 101, a cable L1, and a waterproof member 301. The device body 101 includes a socket 111. The cable L1 includes a plug unit 201 and a cable body 291, and the plug unit 201 is disposed at one end of the cable body 291 and adapted to be connected to the socket 111. The waterproof member 301 is sleeved over at least a portion of the plug unit 201.

In one embodiment, the electronic device D1 further includes a housing 121 and a cover lid 122. The device body 101 is disposed inside the housing 121, and the waterproof member 301 is disposed inside the cover lid 122.

Figure 1C:
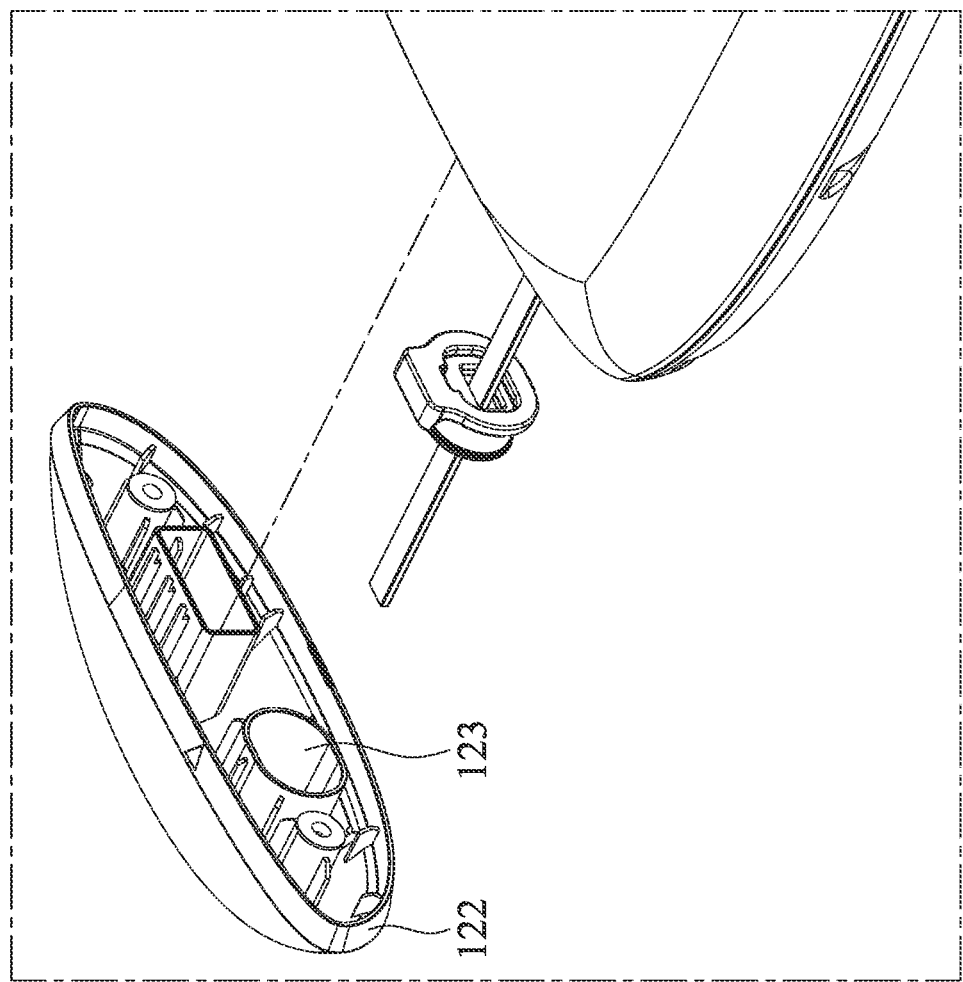
FIG. 1C is a schematic perspective view illustrating detailed structure of a cover lid according to a first embodiment of the present disclosure.
Figure 2A:
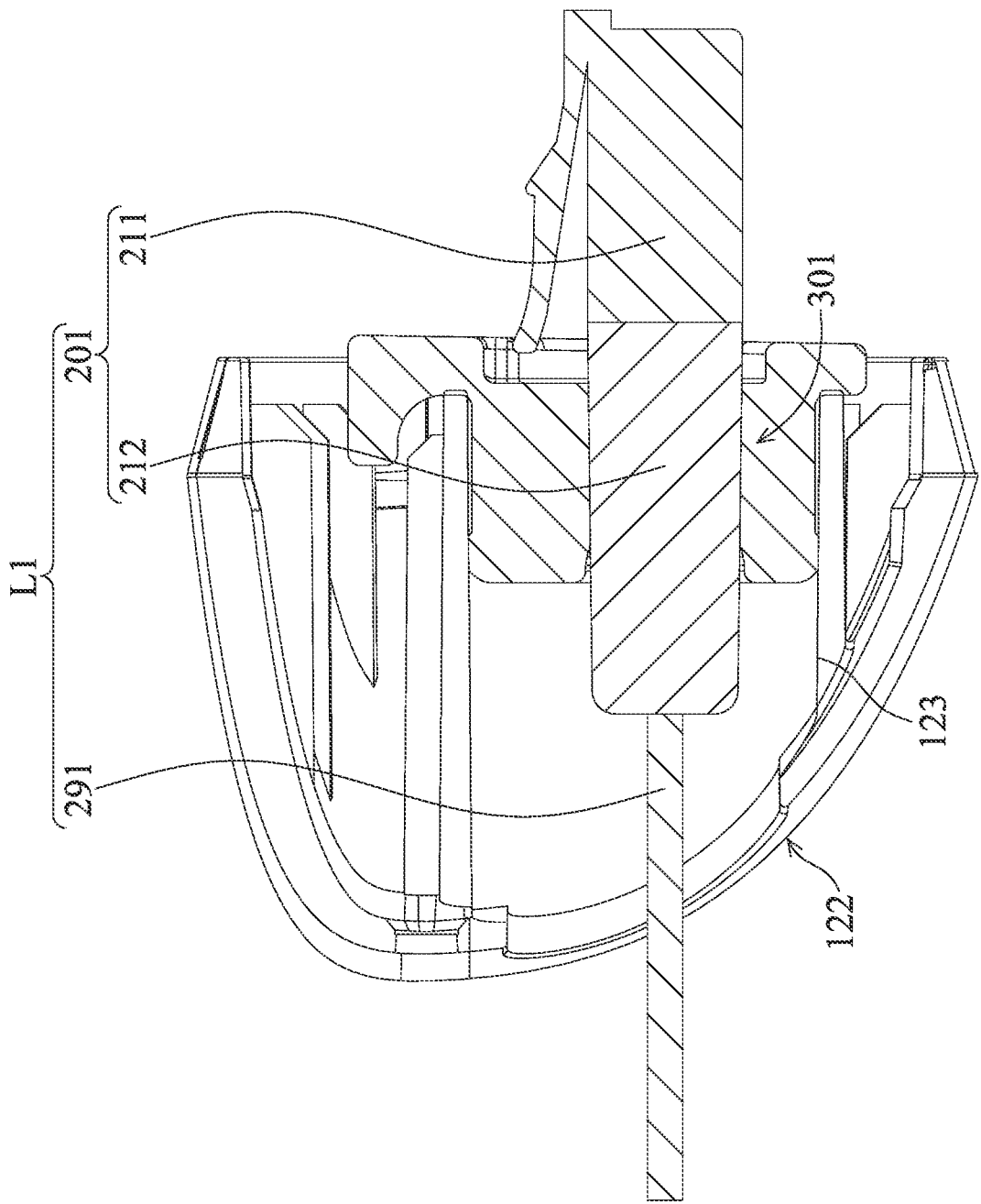
FIG. 2A is a schematic cross-sectional view illustrating main structure of an electronic device according to a first embodiment of the present disclosure.

Referring to FIG. 1C and FIG. 2A, the cover lid 122 includes a mounting slot 123 in one embodiment, and the waterproof member 301 is disposed in the mounting slot 123. The waterproof member 301 is tightly fitted to an inner wall of the mounting slot 123.

Figure 2B:
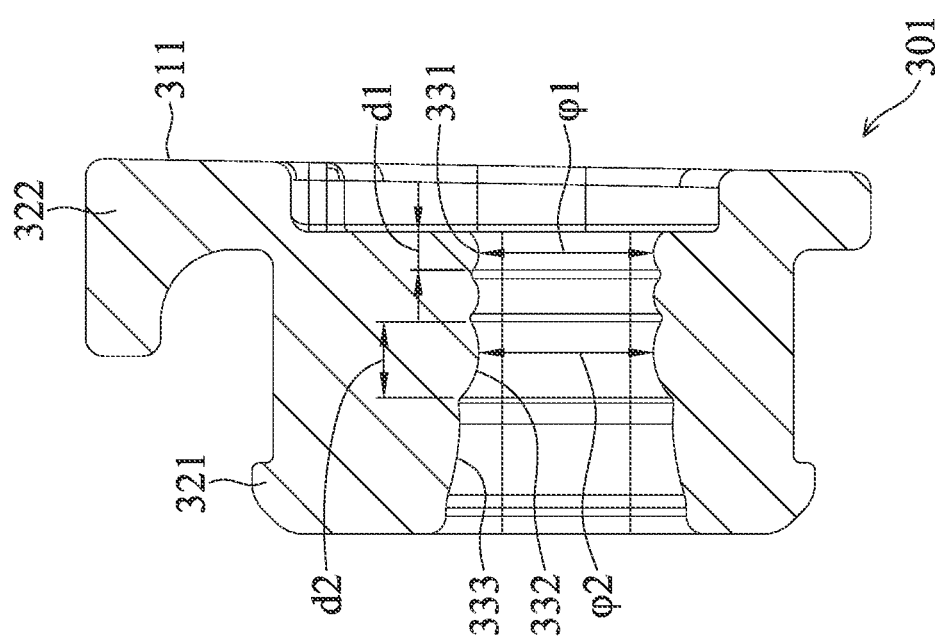
FIG. 2B is a schematic cross-sectional view of a waterproof member according to a first embodiment of the present disclosure.

Referring to FIG. 1B, FIG. 2B, and FIG. 2C, the device body 101 includes a body surface 131 in one embodiment. The socket 111 is located on the body surface 131. The waterproof member 301 includes an abutting surface 311, and the abutting surface 311 is in contact with the body surface 131. The abutting surface 311 of the waterproof member 301 contacting the body surface 131 of the device body 101 provides waterproof protection to the electronic device D1.

Referring to FIG. 2A, FIG. 2B, and FIG. 2C, in one embodiment, the waterproof member 301 includes a rib 321 and a flange 322. The abutting surface 311 is located on the flange 322, and the flange 322 is located at one end of the waterproof member 301. The rib 321 is located at another end of the waterproof member 301 and is tightly fitted to the inner wall of the mounting slot 123. The rib 321 facilitates the installation of the waterproof member 301 to the cover lid 122 to be more convenient and prevents the waterproof member 301 from sliding in the mounting slot 123.

Referring to FIG. 1B, the cover lid 122 is fastened and/or connected to the body surface 131 through a fastener 124 in one embodiment. The fastener 124 is, for example, a bolt or a screw.

Referring to FIG. 2A, FIG. 2B, and FIG. 2C, in one embodiment, the plug unit 201 includes a registered jack 211 and a protective sheath 212. The cable body 291 is connected to the registered jack 211. The protective sheath 212 is disposed on the cable body 291 and abuts the registered jack 211. The waterproof member 301 is sleeved over the protective sheath 212.

In one embodiment, the waterproof member 301 includes a through hole 33. A first enclosed rib 331 and a second enclosed rib 332 are formed in the through hole 33. The first enclosed rib 331 is located between the second enclosed rib 332 and the abutting surface 311. The first enclosed rib 331 has a first inner diameter co 1, and the second enclosed rib 332 has a second inner diameter co 2. The first inner diameter co 1 is smaller than the second inner diameter co 2. In one embodiment, the contact surface between the cable L1 and the through hole 33 also provides waterproof protection.

Referring to FIG. 2B, in one embodiment, the first enclosed rib 331 has a first width d1, and the second enclosed rib 332 has a second width d2. The first width d1 is smaller than the second width d2.

Referring to FIG. 2B and FIB. 2C, in one embodiment, the through hole 33 further has an enlarging portion 333, and the second enclosed rib 332 is located between the enlarging portion 333 and the first enclosed rib 331.

Figure 3A:
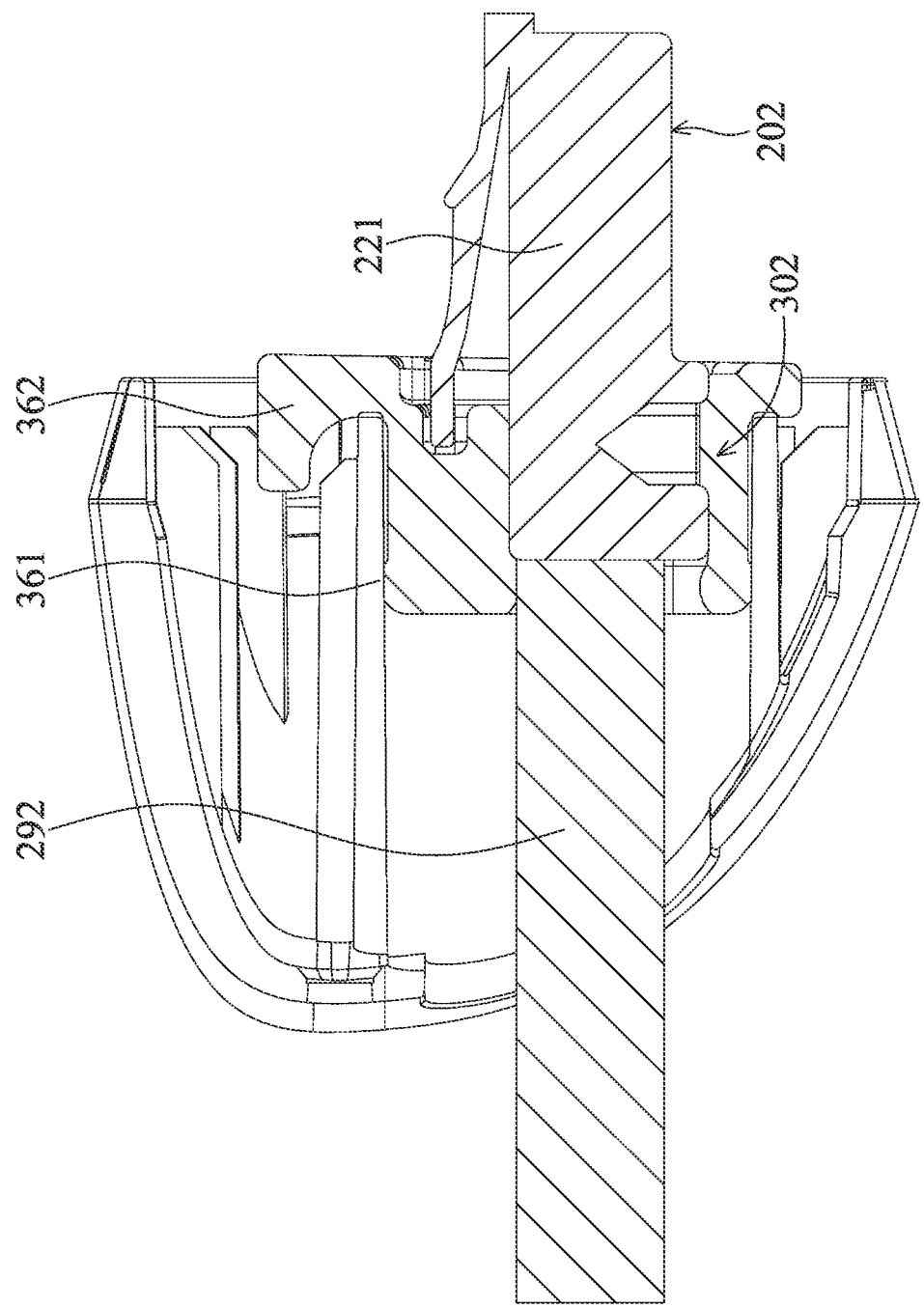
FIG. 3A is a schematic cross-sectional view illustrating main structure of an electronic device according to a second embodiment of the present disclosure.
Figure 3B:
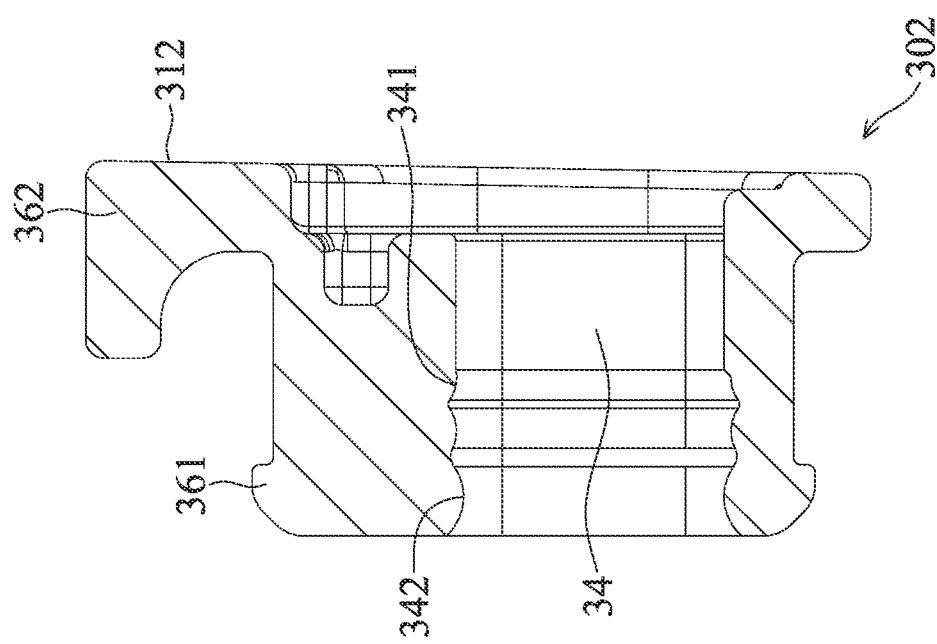
FIG. 3B is a schematic cross-sectional view of a waterproof member according to a second embodiment of the present disclosure.

Referring to FIG. 3A and FIG. 3B, in one embodiment, the plug unit 202 includes a registered jack 221. The cable body 292 is connected to the registered jack 221, and the waterproof member is sleeved over the registered jack 221 and the cable body 292.

Referring to FIG. 3A and FIG. 3B, in one embodiment, the waterproof member 302 includes a through hole 34. A first enclosed rib 341 and a second enclosed rib 342 are formed in the through hole 34. The first enclosed rib 341 is located between the second enclosed rib 342 and the abutting surface 312. The first enclosed rib 341 abuts the registered jack 221, and the second enclosed rib 342 abuts the cable body 292.

Figure 4A:
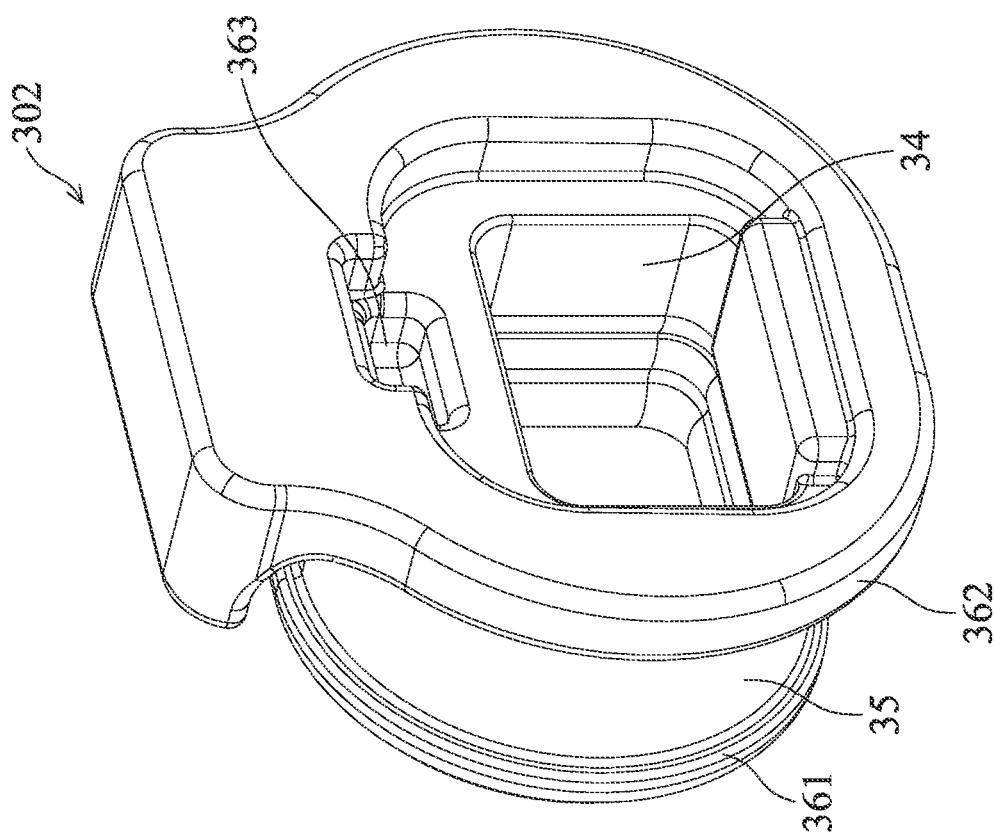
FIG. 4A is a schematic perspective view of a waterproof member according to a second embodiment of the present disclosure.
Figure 4B:
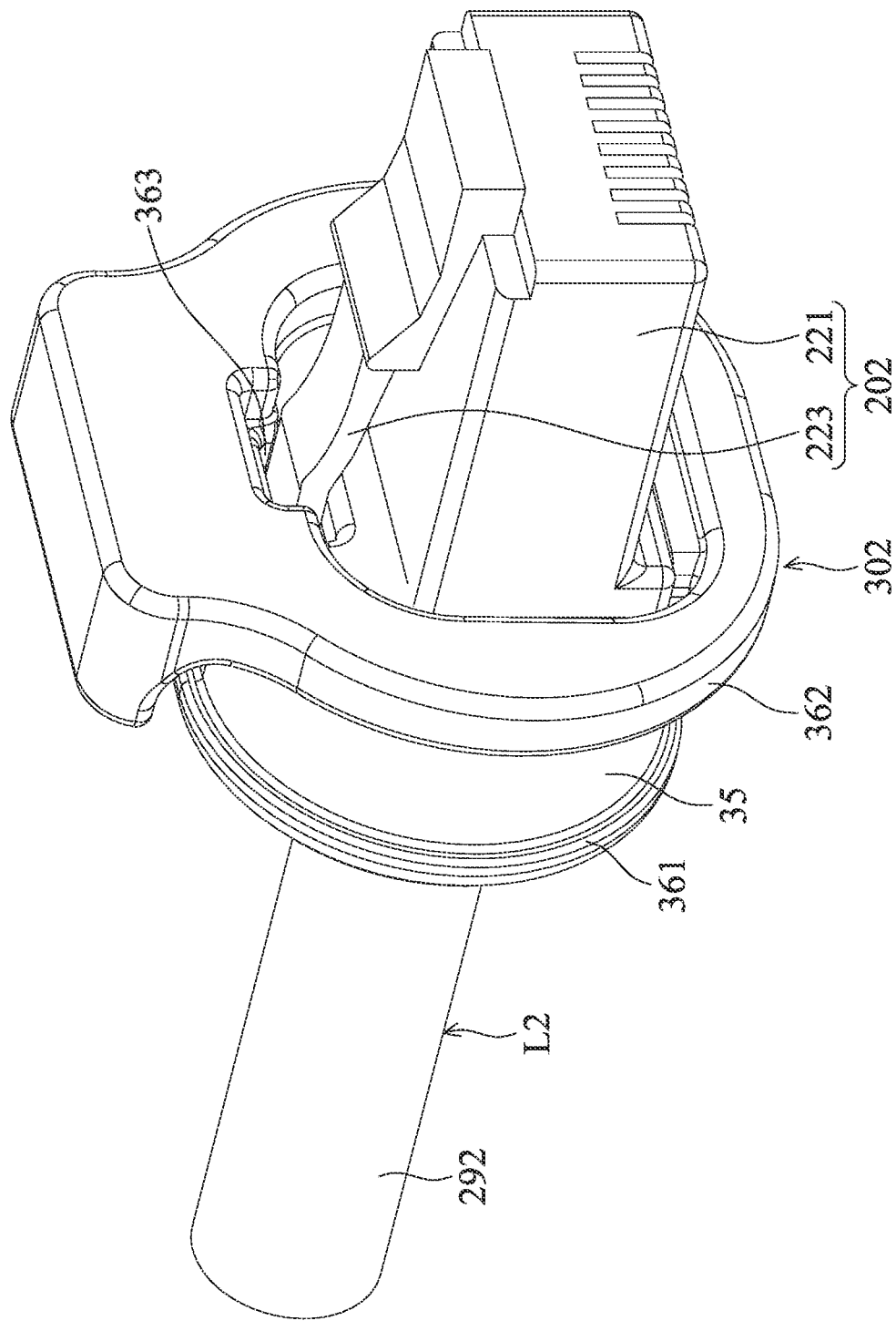
FIG. 4B illustrates a waterproof member according to a second embodiment of the present disclosure being connected with a cable.

Referring to FIG. 4A and FIG. 4B, in one embodiment, the waterproof member 302 is adapted to be sleeved over a cable L2. The waterproof member 302 includes a member body 35 and the member body 35 has a through hole 34 formed therein. The cable L2 includes a plug unit 202 and a cable body 292. The plug unit 202 is disposed at one end of the cable body 292. When the plug unit 202 is passed through the through hole 34, the waterproof member 302 is sleeved over at least a portion of the plug unit 202. In one embodiment, the contact between the cable L2 and the through hole 34 also provides waterproof protection.

In one embodiment, the waterproof member 302 includes a rib 361 and a flange 362. The flange 362 is located at one end of the member body 35, and the rib 361 is located at another end of the member body 35. A recess 363 is formed on the flange 362. The plug unit 202 includes a registered jack 221, and the registered jack 221 includes an elastic arm 223 that is adapted to be placed in the recess 363. In one embodiment, the applied force must be evenly distributed around the rectangular plug unit of the cable L2 in order to achieve waterproof protection, and as such, the risk of waterproof defection caused by over-deformation due to uneven application of force is prevented. By using soft material such as rubber in the waterproof member, the cover lid 122 is able to evenly apply force on the approximately elliptical-shaped (capsule shape) waterproof member through the mounting slot 123, and the force is then further evenly distributed on the cable L2 through the squeezable characteristic of the material of the waterproof member. In another embodiment, the cross-section shape of the through hole 34 may be varied. For example, the part of the through hole 34 which corresponds to the registered jack 221 could have a rectangular cross-section, and the part of the through hole 34 which corresponds to the cable body 292 could have a round cross-section, thereby making the force be more evenly applied on the cable L2, but the present disclosure is not limited thereby.

In one embodiment, the waterproof member is made of elastic material like rubber. The waterproof member of the present disclosure has a simple structure and low cost, and moreover, it is easy to assemble and is adaptable to most cable types for providing waterproof protections. Further-more, the waterproof member of the present disclosure is easy and convenient to assemble and disassemble for users.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device comprising:
    a device body comprising a socket;
    a cable, comprising a plug unit and a cable body, wherein the plug unit is disposed at one end of the cable body and is adapted to be connected to the socket; and
    a waterproof member comprising an elastic material, wherein the waterproof member is sleeved over at least a portion of the plug unit,
    wherein the device body comprises a body surface, the socket is located on the body surface, the waterproof member comprises an abutting surface, and the abutting surface is in contact with the body surface,
    wherein the waterproof member comprises a through hole, a first enclosed rib with a first inner diameter, and a second enclosed rib with a second inner diameter, the first enclosed rib and the second enclosed rib are formed in the through hole, the first enclosed rib is located between the second enclosed rib and the abutting surface, and the first inner diameter is smaller than the second inner diameter,
    wherein the first enclosed rib comprises a first width, the second enclosed rib comprises a second width, and the first width is smaller than the second width,
    wherein the plug unit comprises a registered jack and a protective sheath, the cable body is connected to the registered jack, the protective sheath is disposed on the cable body and abuts the registered jack, the waterproof member is sleeved over the protective sheath, and the first enclosed rib and the second enclosed rib contact the protective sheath.

2. The electronic device according to claim 1, further comprising a housing and a cover lid, wherein the device body is disposed inside the housing, and the waterproof member is disposed inside the cover lid.

3. The electronic device according to claim 2, wherein the cover lid comprises a mounting slot, the waterproof member is disposed in the mounting slot, and the waterproof member is tightly fitted to an inner wall of the mounting slot.

4. The electronic device according to claim 3, wherein the waterproof member comprises a rib and a flange, the abutting surface is located on the flange, the flange is located at one end of the waterproof member, the rib is located at another end of the waterproof member, and the rib is tightly fitted to the inner wall of the mounting slot.

5. The electronic device according to claim 3, wherein the cover lid is fastened to the body surface.

6. The electronic device according to claim 1, wherein the through hole further comprises an enlarging portion, and the second enclosed rib is located between the enlarging portion and the first enclosed rib.

7. A waterproof member, adapted to be sleeved over a cable, the waterproof member comprising
    a member body comprising a through hole and an elastic material;
    an abutting surface;
    a first enclosed rib; and
    a second enclosed rib, wherein the first enclosed rib and the second enclosed rib are formed in the through hole, the first enclosed rib is located between the second enclosed rib and the abutting surface, the first enclosed rib comprises a first inner diameter, the second enclosed rib comprises a second inner diameter, and the first inner diameter is smaller than the second inner diameter,
    wherein the first enclosed rib comprises a first width, the second enclosed rib comprises a second width, and the first width is smaller than the second width,
    wherein the through hole further comprises an enlarging portion, and the second enclosed rib is located between the enlarging portion and the first enclosed rib,
    wherein the cable comprises a cable body and a plug unit, the plug unit is disposed at one end of the cable body, and when the plug unit is inserted to pass through the through hole, the waterproof member is sleeved over at least a portion of the plug unit,
    wherein the plug unit comprises a registered jack and a protective sheath, the cable body is connected to the registered jack, the protective sheath is disposed on the cable body and abuts the registered jack, the waterproof member is sleeved over the protective sheath,
    wherein in an insertion direction of the cable passing through the through hole, the first enclosed rib is located between the second enclosed rib and the registered jack.

8. The waterproof member according to claim 7, further comprising a rib and a flange, wherein the flange is located at one end of the member body, the rib is located at another end of the member body, the flange comprises a recess, the plug unit comprises a registered jack with an elastic arm, and the elastic arm is adapted to be placed in the recess.

* * * * *